US009806162B2

(12) United States Patent
Ohtani et al.

(10) Patent No.: US 9,806,162 B2
(45) Date of Patent: Oct. 31, 2017

(54) SEMICONDUCTOR DEVICE HAVING A PLURALITY OF TRANSISTORS CONNECTED IN PARALLEL

(71) Applicant: Renesas Electronics Corporation, Kawasaki-shi, Kanagawa (JP)

(72) Inventors: Kinya Ohtani, Kanagawa (JP); Kenji Okada, Kanagawa (JP); Yasuhiro Nishimura, Kanagawa (JP); Noriaki Mukaide, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/802,577

(22) Filed: Jul. 17, 2015

(65) Prior Publication Data
US 2016/0027736 A1    Jan. 28, 2016

(30) Foreign Application Priority Data

Jul. 28, 2014 (JP) ................................ 2014-152701

(51) Int. Cl.
| | | |
|---|---|---|
| *H01L 29/423* | (2006.01) | |
| *H01L 27/088* | (2006.01) | |
| *H01L 27/02* | (2006.01) | |
| *H01L 29/78* | (2006.01) | |

(52) U.S. Cl.
CPC .... *H01L 29/42372* (2013.01); *H01L 29/4236* (2013.01); *H01L 29/4238* (2013.01); *H01L 29/7813* (2013.01); *H01L 27/0207* (2013.01); *H01L 27/088* (2013.01); *H01L 29/7802* (2013.01); *H01L 29/7816* (2013.01); *H01L 2924/0002* (2013.01)

(58) Field of Classification Search
CPC ........... H01L 29/4236; H01L 29/42372; H01L 29/4238; H01L 29/7825
See application file for complete search history.

(56) References Cited

U.S. PATENT DOCUMENTS

| | | | | |
|---|---|---|---|---|
| 2005/0145936 A1* | 7/2005 | Polzl | ..................... | H01L 29/402 257/341 |
| 2008/0007683 A1* | 1/2008 | Makida | ............... | G02F 1/13452 349/139 |
| 2009/0269920 A1* | 10/2009 | Park | ................... | H01L 21/0272 438/618 |

FOREIGN PATENT DOCUMENTS

JP           2011-134984 A        7/2011

* cited by examiner

*Primary Examiner* — Phat X Cao
(74) *Attorney, Agent, or Firm* — Sughrue Mion, PLLC (57) ABSTRACT

A semiconductor device SD includes a substrate SUB, a plurality of gate electrodes GE, a gate pad GEP, and gate interconnects GINC. The plurality of gate electrodes GE are formed in the substrate SUB, and extend electrically in parallel to each other. The gate pad GEP is formed in a region different from that in which the plurality of gate electrodes GE are formed in the substrate SUB. Each of a plurality of gate interconnects GINC connects the plurality of gate electrodes GE to the gate pad GEP.

4 Claims, 12 Drawing Sheets

SEMICONDUCTOR DEVICE HAVING A PLURALITY OF TRANSISTORS CONNECTED IN PARALLEL

This application is based on Japanese patent application No. 2014-152701, the content of which is incorporated hereinto by reference.

BACKGROUND

Technical Field

The present invention relates to a semiconductor device, and to a technique applicable to, for example, a semiconductor device having a plurality of transistors connected in parallel to each other.

Related Art

In semiconductor devices in which power is controlled, a plurality of transistors for power control are often connected in parallel to each other. For example, Japanese Unexamined Patent Publication No. 2011-134984 discloses a semiconductor device having gate electrodes of a plurality of transistors and a gate pad connected to each other by one interconnect. When the semiconductor device having such a structure is used in a switching power supply device, as disclosed in Japanese Unexamined Patent Publication No. 2011-134984, ringing occurs during the turn-on and turn-off of transistors, and as a result, noise is generated in this semiconductor device. This causes the occurrence of voltage and current ringing due to parasitic LC of the semiconductor device itself and parasitic LC of the substrate itself when a switching semiconductor device is turned on and off. Such ringing gives rise to EMI noise (electromagnetic interference (noise)), which results in an adverse influence on various electronic devices.

Regarding the generation of noise from the semiconductor device, Japanese Unexamined Patent Publication No. 2011-134984 discloses that, in some transistors, the product (charging and discharging time constant) of the resistance of a gate electrode and the capacitance between gate electrodes is made to be larger than in other transistors.

In order to reduce EMI noise, it is important how the ringing which is the cause of the noise occurring due to the turn-on and turn-off of a switching semiconductor device is suppressed. In order to prevent such ringing, a method of inserting gate resistance and delaying a switching speed is considered. Incidentally, when a through-current is prevented from being generated by delaying a switching speed, a dead time period is required to be provided. In addition, in a switching semiconductor element which is used in a motor driving inverter, there is a problem of a drop in the efficiency of a motor.

When a plurality of transistors are connected in parallel to each other, it is preferable that a current flows equally in the plurality of transistors. However, in the technique disclosed in Japanese Unexamined Patent Publication No. 2011-134984, since charging and discharging time constants are caused to be different from each other between transistors, and thus it is necessary to cause the structure of some of the transistors to be different from the structure of other transistors. In this case, there is the possibility of a current concentrating on a specific transistor.

Other problems and novel features will be made clearer from the description and the accompanying drawings of the present specification.

SUMMARY

In one embodiment, there is provided a semiconductor device including a substrate, a plurality of gate electrodes, and a plurality of gate interconnects. The plurality of gate interconnects are formed in the substrate, and extend in parallel to each other. A gate terminal is formed in a region different from that in which the plurality of gate electrodes are formed in the substrate. The gate interconnects are connected in parallel to each other, and connect each of the plurality of gate electrodes to the gate terminal.

In another embodiment, there is provided a semiconductor device including a substrate, a plurality of gate electrodes, a first gate interconnect, a gate terminal, and a second gate interconnect. The plurality of gate electrodes are formed in the substrate, and extend in parallel to each other. The first gate interconnect is connected to each of the plurality of gate electrodes. The gate terminal is formed in a place different from that in which the plurality of gate electrodes and the first gate interconnect are formed in the substrate. The second gate interconnect connects the gate terminal and the first gate interconnect to each other. A resistance value of the first gate interconnect per unit length is larger than a resistance value of the second gate interconnect per unit length.

According to the embodiments, it is possible to suppress the concentration of a current on a specific transistor while suppressing ringing.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the accompanying drawings. In all the drawings, like elements are referenced by like reference numerals and descriptions thereof will not be repeated.

(First Embodiment)

Figure 1:
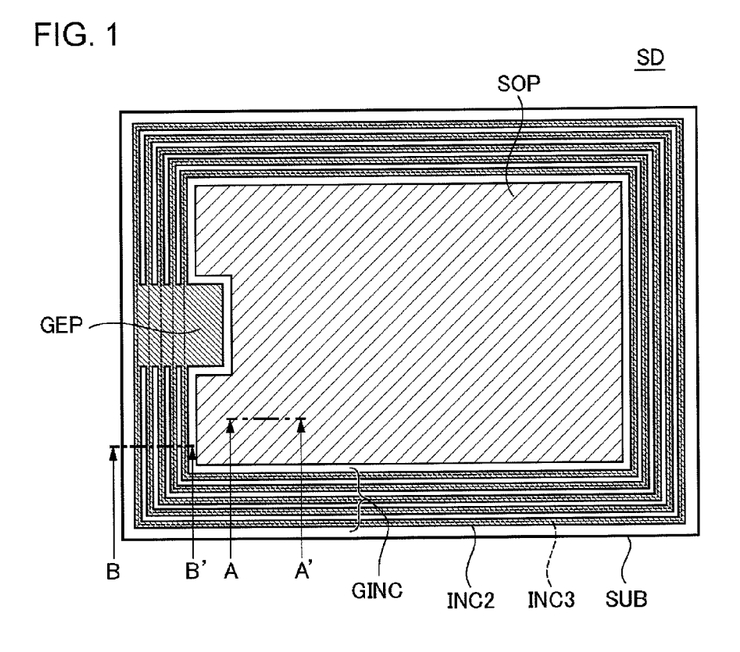
FIG. 1 is a plan view illustrating a configuration of a semiconductor device according to a first embodiment.
Figure 2:
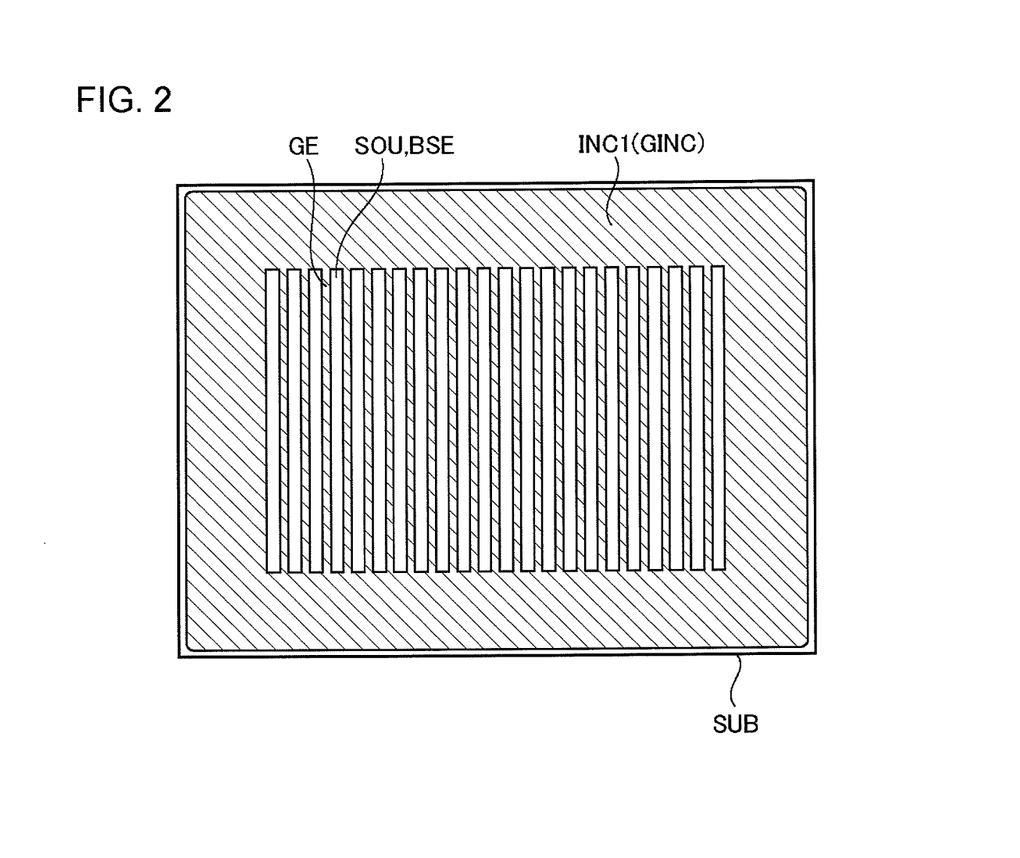
FIG. 2 is a diagram in which members located above a first layer of a gate interconnect are removed from FIG. 1.
Figure 3:
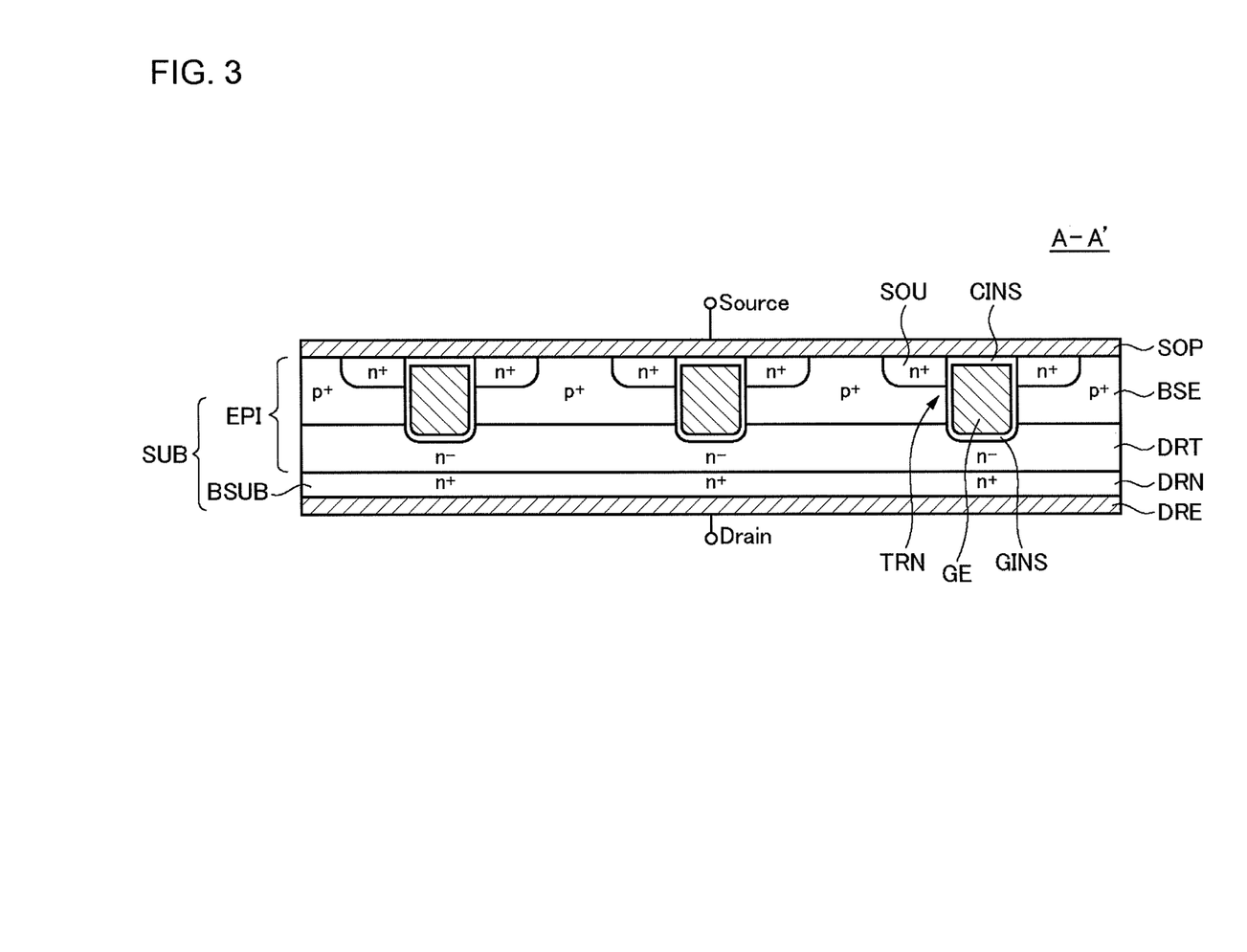
FIG. 3 is a cross-sectional view taken along line A-A' of FIG. 2.

FIG. 1 is a plan view illustrating a configuration of a semiconductor device SD according to a first embodiment. FIG. 2 is a diagram in which members located above a first layer INC1 of a gate interconnect GINC are removed from FIG. 1. FIG. 3 is a cross-sectional view taken along line A-A' of FIG. 1.

The semiconductor device SD includes a plurality of transistors. The semiconductor device SD is a semiconductor device for power control, and is used as, for example, a switching power supply. For this reason, the plurality of transistors are turned on and off at a high frequency. Meanwhile, a load which is driven by the semiconductor device SD is, for example, a motor, but may be electronic devices other than the motor.

The semiconductor device SD includes a substrate SUB, a plurality of gate electrodes GE, a gate pad GEP (gate terminal), and gate interconnects GINC. The plurality of gate electrodes GE is formed in the substrate SUB as shown in FIG. 2, and extend electrically in parallel to each other. As shown in FIG. 1, the gate pad GEP is formed in a region different from that in which the plurality of gate electrodes GE are formed in the substrate SUB. The plurality of gate electrodes GE are connected to the gate pad GEP by each of a plurality of gate interconnects GINC. Hereinafter, a case where a transistor having the semiconductor device SD is a vertical transistor will be described in detail.

As shown in FIG. 3, the substrate SUB has an epitaxial layer EPI formed on a semiconductor substrate BSUB. The semiconductor substrate BSUB is, for example, a bulk silicon substrate, and the semiconductor substrate BSUB having a first conductivity type ($n^+$-type in an example shown in the drawing) functions as a drain DRN of a transistor. The epitaxial layer EPI is a semiconductor layer (for example, silicon layer) which is epitaxially grown on the semiconductor substrate BSUB, and is a layer having, for example, a first conductivity type (for example, $n^-$-type) thinner than the semiconductor substrate BSUB. As shown in FIGS. 1 and 2, the planar shape of the substrate SUB is, for example, rectangular.

Meanwhile, the epitaxial layer EPI may be a compound semiconductor such as GaN or GaAlN.

As shown in FIG. 3, a base layer BSE of a second conductivity type (for example, p-type) is formed in the surface layer of the epitaxial layer EPI. The base layer BSE is formed by implanting, for example, p-type impurity ions into the epitaxial layer EPI. A portion of the epitaxial layer EPI in which the base layer BSE is not formed functions as a drift layer DRT of the drain DRN.

A plurality of trenches TRN are formed in the epitaxial layer EPI. The plurality of trenches TRN extend in parallel to each other. Each of the trenches TRN passes through the base layer BSE. A gate insulating film GINS is formed on the inner wall and the bottom of the trench TRN. A gate electrode GE is buried in a portion of the trench TRN in which the gate insulating film GINS is not formed. The gate electrode GE is formed of, for example, polysilicon. The upper surface of the gate electrode GE is covered with an insulating film CINS. The insulating film CINS is formed by thermally oxidizing, for example, the gate electrode GE.

In addition, a source SOU of a first conductivity type (for example, $n^+$-type) is formed in a region of the epitaxial layer EPI which is located around the trench TRN. The source SOU is formed by implanting n-type impurities into the base layer BSE.

A source pad SOP is formed of, for example, Al on the epitaxial layer EPI, and is connected to both the source SOU and the base layer BSE. In addition, a drain electrode DRE is formed on a surface of the semiconductor substrate BSUB (drain DRN) where the epitaxial layer EPI is not formed. The drain electrode DRE is formed of, for example, Al.

As shown in FIGS. 1 and 2, when seen in a plan view, a plurality of transistors are surrounded by the gate interconnects GINC. Specifically, the gate interconnects GINC are formed along the edge of the substrate SUB. A portion of the gate interconnects GINC serves as the gate pad GEP.

Figure 4:
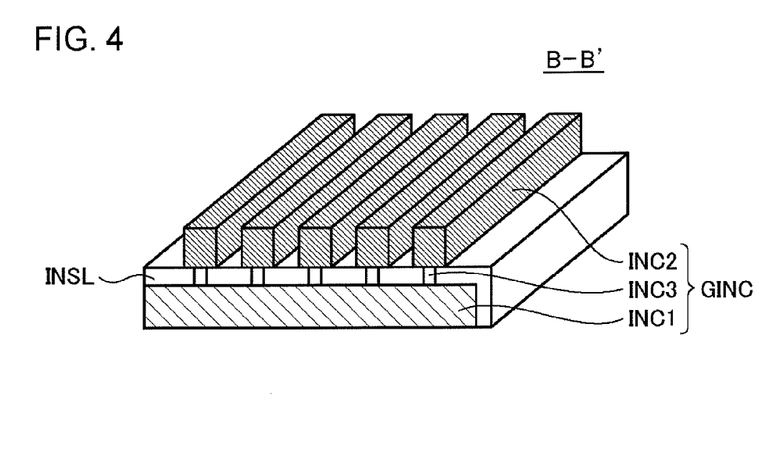
FIG. 4 is a cross-sectional view taken along line B-B' of FIG. 1.

FIG. 4 is a cross-sectional view taken along line B-B' of FIG. 1. As shown in FIGS. 4, 1, and 2, the gate interconnects GINC have a structure in which the first layer INC1, a third layer INC3, and a second layer INC2 are laminated in this order.

As shown in FIG. 2, the first layer INC1 is formed integrally with the gate electrode GE. Specifically, the first layer INC1 is formed along the edge of the substrate SUB. The trench TRN and the gate electrode GE are formed in a hollow portion of the first layer INC1. The trench TRN and the gate electrode GE extend, for example, in parallel to one side of the substrate SUB. However, the trench TRN and the gate electrode GE may be formed in a mesh shape in the hollow portion of the first layer INC1.

As shown in FIG. 4, an insulating interlayer INSL is formed on the first layer INC1. The insulating interlayer INSL is also formed on the substrate SUB. The second layer INC2 is formed on the insulating interlayer INSL. The second layer INC2 is formed of a material having a lower resistance than that of the first layer INC1, for example, a metal material such as Al, and is formed in, for example, the same process as that in which the source pad SOP is formed. In addition, a portion of the second layer INC2 serves as the gate pad GEP shown in FIG. 1.

The third layer INC3 is buried in the insulating interlayer INSL. The insulating interlayer INSL is, for example, a silicon oxide film. The third layer INC3 is formed of a material having a lower resistance than that of the first layer INC1, for example, W, and also serves as a contact through which the second layer INC2 and the first layer INC1 are connected to each other.

Specifically, the second layer INC2 is constituted by a plurality of interconnects. The plurality of interconnects are electrically provided in parallel, and extend in parallel to each other. The width of each interconnect is smaller than the width of the first layer INC1. Each of the plurality of interconnects connects the plurality of gate electrodes GE to the gate pad GEP in parallel to each other. The third layer INC3 is provided in each of a plurality of interconnects constituting the second layer INC2.

Meanwhile, a portion of the source pad SOP to be connected to the source SOU and the base layer BSE is buried within an opening which is provided in the insulating interlayer INSL.

Next, a method of manufacturing the semiconductor device SD will be described. First, the epitaxial layer EPI is formed on the semiconductor substrate BSUB.

Next, a mask pattern (not shown) is formed on the epitaxial layer EPI, and the epitaxial layer EPI is etched using this mask pattern as a mask. Thereby, a plurality of trenches TRN are formed in the epitaxial layer EPI. Thereafter, the mask pattern is removed.

Next, the epitaxial layer EPI is thermally oxidized. Thereby, the gate insulating film GINS is formed on the inner wall of the trench TRN. In this process, a thermal oxide film is also formed on the bottom of the trench TRN.

Meanwhile, a process of thermally oxidizing the basal portion of the lateral side and the bottom of the trench TRN is performed separately from the process of forming the gate insulating film GINS, and a thermal oxide film located thereon may be made thicker than the gate insulating film GINS.

Next, a conductive film (for example, polysilicon film) is formed on the epitaxial layer EPI and within the trench TRN. Next, a mask pattern (not shown) is formed on this conductive film, and the conductive film is etched using this mask pattern as a mask. Thereby, the gate electrode GE and the first layer INC1 of the gate interconnect GINC are formed. Thereafter, the mask pattern is removed.

Next, the base layer BSE is formed by implanting impurity ions into the epitaxial layer EPI. Further, a mask pattern (not shown) is formed on the epitaxial layer EPI, and impurity ions are implanted into the epitaxial layer EPI using this mask pattern as a mask. Thereby, the source SOU is formed within the base layer BSE.

Meanwhile, before the trench TRN is formed, the base layer BSE and the source SOU may be formed.

Next, the insulating interlayer INSL is formed on the epitaxial layer EPI. Next, a mask pattern is formed on the insulating interlayer INSL, and the insulating interlayer INSL is etched using this mask pattern as a mask. Thereby, an opening pattern for burying the third layer INC3 of the gate insulating film GINS and an opening pattern for connecting the source pad SOP to the source SOU and the base layer BSE are formed in the insulating interlayer INSL.

Next, a metal film (for example, W film) is formed within the insulating interlayer INSL and the opening of the insulating interlayer INSL, and this metal film is selectively removed. Thereby, the third layer INC3 of the gate interconnect GINC is formed.

Next, a metal film (for example, Al film) is formed on the insulating interlayer INSL and within the opening of the insulating interlayer INSL, and this metal film is selectively removed. Thereby, the second layer INC2 of the gate interconnect GINC, the source pad SOP, and the gate pad GEP are formed.

Thereafter, the drain electrode DRE is formed on the semiconductor substrate BSUB.

In such a configuration, in order to maintain the response characteristics of the transistor while suppressing ringing of the gate electrode GE, a resistance value between the gate pad GEP and the plurality of gate electrodes GE is required to be set to an appropriate value. This value changes the dimensions and configuration of the transistor, the frequency of a driving signal to be input, and the like.

Figure 5:
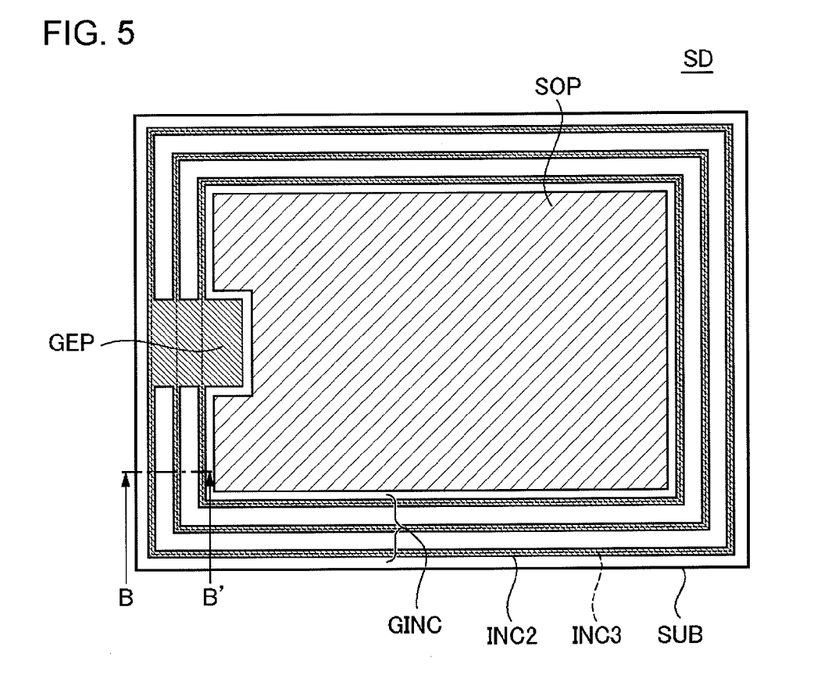
FIG. 5 is a plan view illustrating a modified example of FIG. 1.

In the present embodiment, as shown in FIGS. 1 and 5, the number of interconnects constituting the second layer INC2 is increased and decreased, thereby allowing the resistance value (that is, resistance value of the gate interconnect GINC) between the gate pad GEP and the plurality of gate electrodes GE to be set to a desired value.

Figure 12:
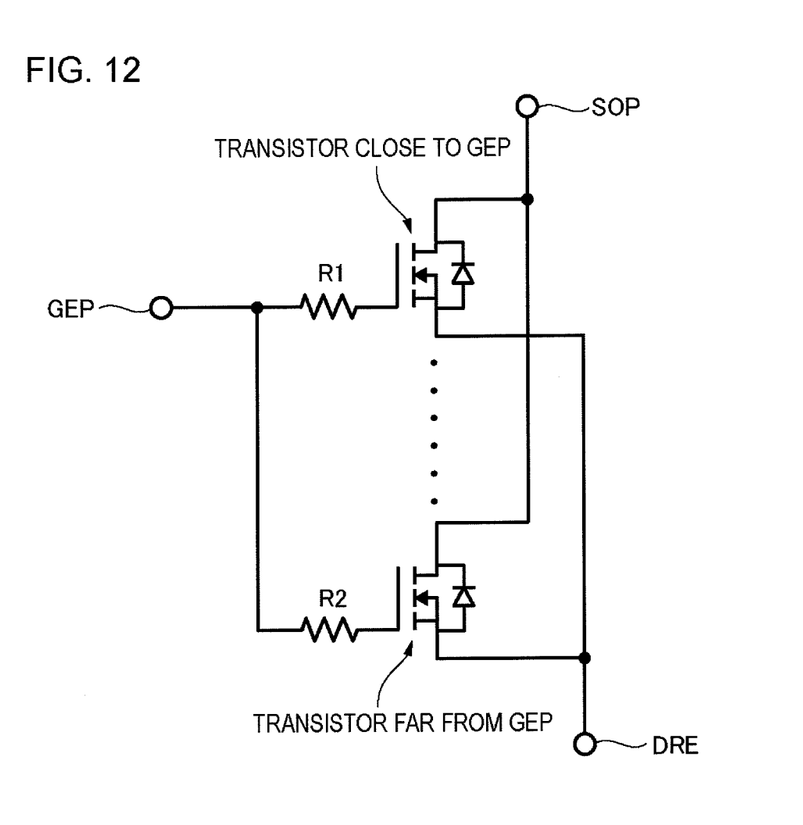
FIG. 12 is a diagram illustrating an example of an equivalent circuit diagram according to a semiconductor device SD shown in FIG. 1.

FIG. 12 is an example of an equivalent circuit diagram of the semiconductor device SD shown in FIG. 1. The semiconductor device SD has a configuration in which a plurality of transistors are connected in parallel to each other. In the semiconductor device SD, resistance between the gate pad GEP and the gate electrode GE of a transistor far from the gate pad GEP becomes larger than resistance between the gate pad GEP and the gate electrode GE of a transistor close to the gate pad GEP. This allows a CR delay to be changed for each transistor. A delay occurs in the transistors in order from the side close to the gate pad GEP, and as a result, dv/dt of the entire switching can be made gentle. Thereby, even when the transistors are turned on and off at a high frequency, ringing is not likely to occur. Therefore, it is possible to suppress the generation of noise from the semiconductor device SD.

Particularly, as in the present embodiment, when the second layer INC2 and the third layer INC3 are formed of a material having a lower resistance than that of the first layer INC1, the resistance value of the gate interconnect GINC varies greatly depending on the number of interconnects constituting the second layer INC2 and the number of third layers INC3. Therefore, the resistance value of the gate interconnect GINC is easily set to a desired value. In this manner, in the present embodiment, it is possible to simply adjust the value of the gate resistance, and to facilitate an optimum design of a dead time period in which ringing is prevented and a through-current is prevented.

(Second Embodiment)

Figure 6:
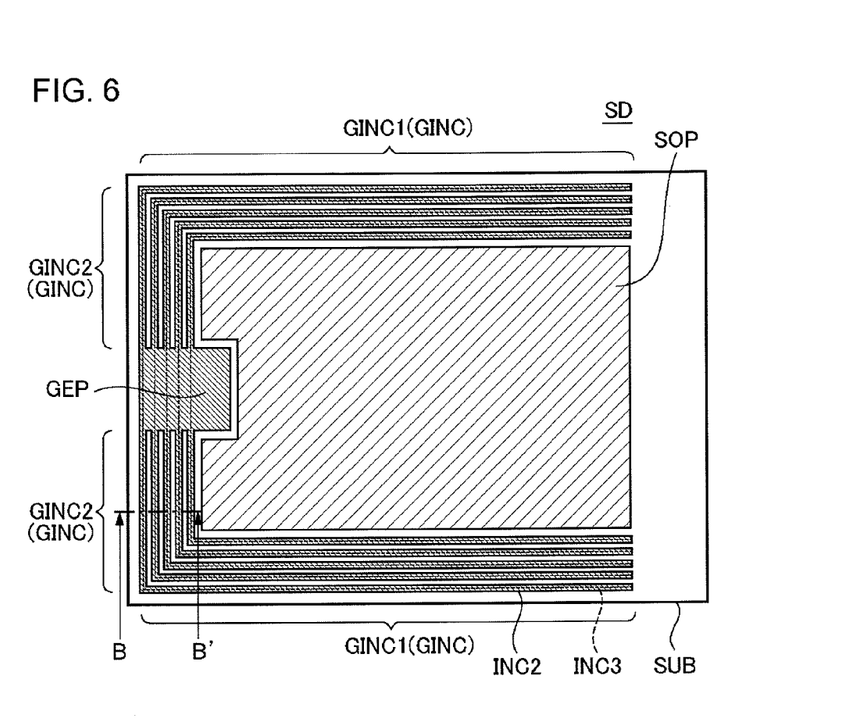
FIG. 6 is a plan view illustrating a semiconductor device according to a second embodiment.

FIG. 6 is a plan view illustrating a semiconductor device SD according to a second embodiment, and corresponds to FIG. 1 in the first embodiment. The semiconductor device SD shown in the drawing has the same configuration as that of the semiconductor device SD according to the first embodiment, except that the gate interconnect GINC is not provided in a portion of the edge of the substrate SUB.

Specifically, the gate interconnect GINC extends up to each of both ends of the gate electrode GE which is farthest from the gate pad GEP of the plurality of gate electrodes GE in the circumference of the semiconductor device SD, but is not provided in at least a portion between the both ends.

For example, in an example shown in FIG. 6, the planar shape of the semiconductor device SD is rectangular. The plurality of gate electrodes GE extend in a direction parallel to the short side of the semiconductor device SD. The gate interconnect GINC is provided along one short side and two long sides of the semiconductor device SD so as to surround the gate electrode GE, but is not formed in a portion along the remaining one short side. The gate pad GEP is provided in a portion of the gate interconnect GINC which is located at the short side.

In the present embodiment, the same effect as that in the first embodiment is also obtained.

(Third Embodiment)

Figure 7:
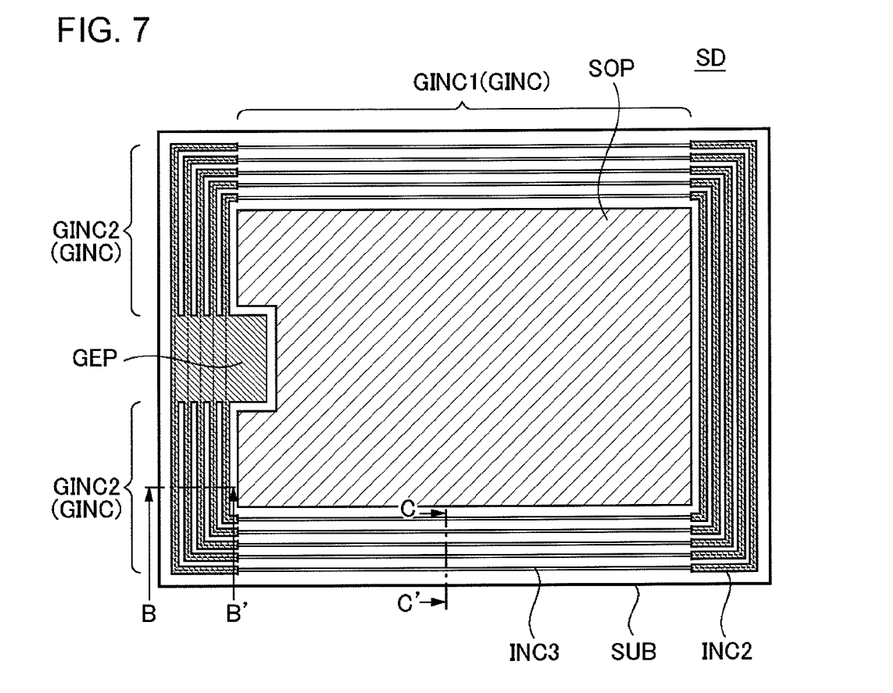
FIG. 7 is a plan view illustrating a semiconductor device according to a third embodiment.
Figure 8:
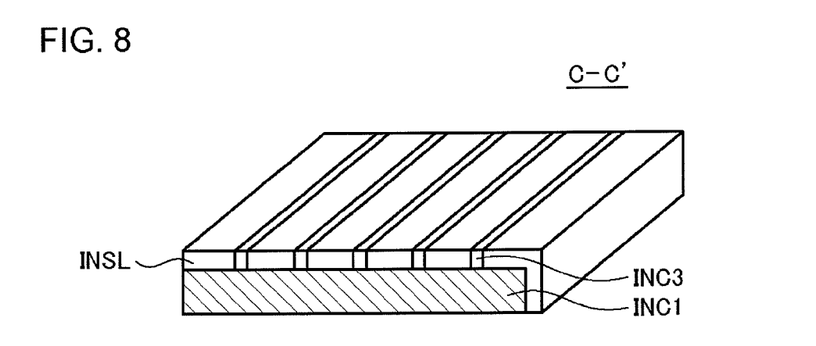
FIG. 8 is a cross-sectional view taken along line C-C' of FIG. 7.

FIG. 7 is a plan view illustrating a semiconductor device SD according to a third embodiment, and corresponds to FIG. 1 in the first embodiment. FIG. 8 is a cross-sectional view taken along line C-C' of FIG. 7. The semiconductor device SD according to the present embodiment has the same configuration as that of the semiconductor device SD according to the first or second embodiment, except for the following points. The drawing shows the same case as in the first embodiment. Meanwhile, cross-section B-B' of FIG. 7 is as shown in FIG. 4.

First, the gate interconnect GINC includes a first gate interconnect GINC1 and a second gate interconnect GINC2. The first gate interconnect GINC1 is a portion of the gate interconnect GINC which is connected to each of a plurality of gate electrodes GE. The second gate interconnect GINC2 connects the first gate interconnect GINC1 and the gate pad GEP to each other. The resistance value of the first gate interconnect GINC1 per unit length is larger than the resistance value of the second gate interconnect GINC2 per unit length.

Specifically, the second gate interconnect GINC2 has a configuration in which a first layer INC1, a third layer INC3, and a second layer INC2 are laminated. On the other hand, the first gate interconnect GINC1 has a configuration in which the first layer INC1 and the third layer INC3 are laminated. In other words, the second gate interconnect GINC2 has a configuration in which the first layer INC1 and the second layer INC2 are laminated, whereas the first gate interconnect GINC1 includes the first layer INC1 but does not include the second layer INC2.

In the present embodiment, the same effect as that in the first embodiment is also obtained. In addition, the resistance value of the first gate interconnect GINC1 per unit length is larger than the resistance value of the second gate interconnect GINC2 per unit length. Therefore, it is possible to suppress the occurrence of ringing while suppressing the resistance of the entire gate interconnect GINC.

In addition, in the present embodiment, the second layer INC2 is removed from the first gate interconnect GINC1, and thus the resistance value of the first gate interconnect GINC1 per unit length is made to be larger than the resistance value of the second gate interconnect GINC2 per unit length. For this reason, the manufacturing cost of the semiconductor device SD does not increase.

(Fourth Embodiment)

Figure 9:
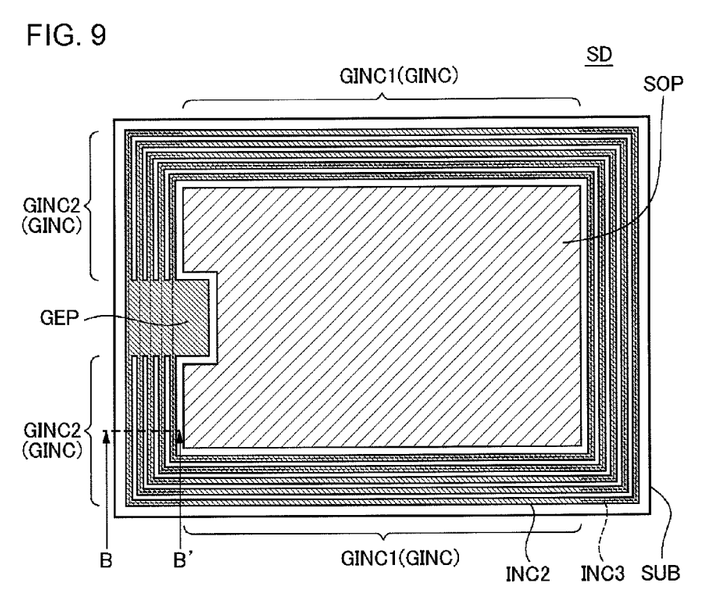
FIG. 9 is a plan view illustrating a configuration of a semiconductor device according to a fourth embodiment.

FIG. 9 is a plan view illustrating a configuration of a semiconductor device SD according to a fourth embodiment, and corresponds to FIG. 7 in the third embodiment. The semiconductor device SD according to the present embodiment has the same configuration as that of the semiconductor device SD according to the third embodiment, except for the following points.

First, a plurality of second layer INC2 of the gate interconnect GINC are all formed in an annular shape so as to surround a plurality of gate electrodes GE. However, in the first gate interconnect GINC1, the third layer INC3 is not formed below at least a portion of the second layer INC2. For this reason, in the first gate interconnect GINC1, since a portion of the second layer INC2 is not connected to the first layer INC1, the resistance value of the first gate interconnect GINC1 per unit length becomes larger than the resistance value of the second gate interconnect GINC2 per unit length.

Therefore, in the present embodiment, the same effect as that in the third embodiment is also obtained.

(Fifth Embodiment)

Figure 10:
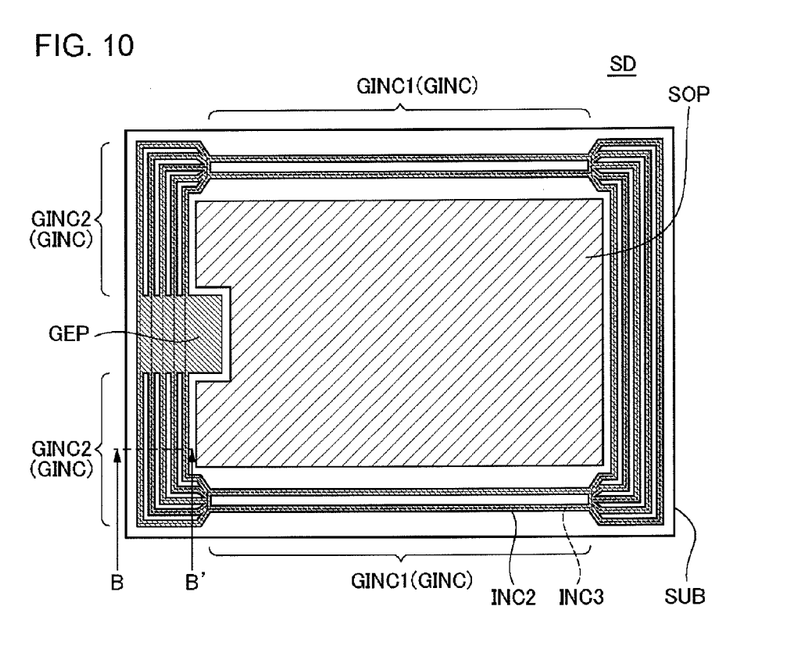
FIG. 10 is a plan view illustrating a configuration of a semiconductor device according to a fifth embodiment.

FIG. 10 is a plan view illustrating a configuration of a semiconductor device SD according to a fifth embodiment, and corresponds to FIG. 7 in the third embodiment. The semiconductor device SD according to the present embodiment has the same configuration as that of the semiconductor device SD according to the third embodiment, except for the following points.

First, the first gate interconnect GINC1 has the second layer INC2. The number of second layers INC2 and the number of third layers INC3 in the first gate interconnect GINC1 are smaller than the number of second layers INC2 and the number of third layers INC3 in the second gate interconnect GINC2. Meanwhile, the width of the second layer INC2 in the first gate interconnect GINC1 is substantially equal to the width of the second layer INC2 in the second gate interconnect GINC2. For this reason, the total value of the widths of the second layer INC2 in the second gate interconnect GINC2 is smaller than the total value of the widths of the second layer INC2 in the first layer INC1.

For this reason, in the present embodiment, the resistance value of the first gate interconnect GINC1 per unit length is also larger than the resistance value of the second gate interconnect GINC2 per unit length. Therefore, the same effect as that in the third embodiment is obtained.

In addition, the width of the second layer INC2 in the first gate interconnect GINC1 is made to be equal to the width of the second layer INC2 in the second gate interconnect GINC2, and then the resistance of the gate interconnect GINC is changed by changing the number of second layers INC2. Therefore, as compared to a case where the second layer INC2 is formed by one interconnect, it is possible to suppress the occurrence of a variation in the width of the second layer INC2 when the second layer INC2 is patterned.

(Sixth Embodiment)

Figure 11:
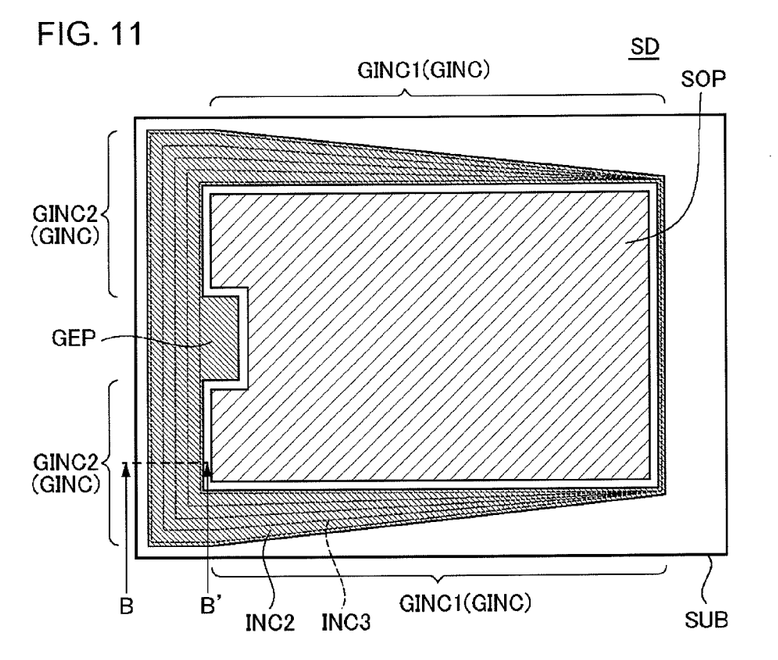
FIG. 11 is a plan view illustrating a configuration of a semiconductor device according to a sixth embodiment.

FIG. 11 is a plan view illustrating a configuration of a semiconductor device SD according to a sixth embodiment, and corresponds to FIG. 10 in the fifth embodiment. The semiconductor device SD according to the present embodiment has the same configuration as that of the semiconductor device SD according to the fifth embodiment, except for the following points.

First, the second layer INC2 of the gate interconnect GINC is formed by one interconnect. The width of the second layer INC2 in the second gate interconnect GINC2 is constant, but the width of the second layer INC2 in the first gate interconnect GINC1 decreases with increasing distance from the gate pad GEP. For this reason, the resistance value of the first gate interconnect GINC1 per unit length increases with increasing distance from the gate pad GEP. The width of the second layer INC2 becomes smallest in a portion of the gate interconnect GINC which is located at the opposite side to the second gate interconnect GINC2.

In the present embodiment, the resistance value of the first gate interconnect GINC1 per unit length is also larger than the resistance value of the second gate interconnect GINC2 per unit length. Therefore, the same effect as that in the third embodiment is obtained. In addition, the resistance value of the first gate interconnect GINC1 per unit length increases with increasing distance from the gate pad GEP. Therefore, it is possible to further suppress the generation of ringing.

As described above, while the present invention devised by the inventor has been described specifically based on the embodiments thereof, the present invention is not limited to the above-mentioned embodiments, and it goes without saying that various changes and modifications may be made without departing from the scope of the invention. For example, a plurality of transistors including the semiconductor device SD are not required to be vertical transistors, and may be planar transistors.

It is apparent that the present invention is not limited to the above embodiment, and may be modified and changed without departing from the scope and spirit of the invention.

What is claimed is:

1. A semiconductor device comprising:
   a substrate;
   a plurality of gate electrodes, formed in the substrate, which extend in parallel to each other;
   a first gate interconnect comprising a plurality of connecting portions connected to each of the plurality of gate electrodes;
   a gate terminal which is formed in a place different from that in which the plurality of gate electrodes and the first gate interconnect are formed in the substrate; and
   a second gate interconnect that connects the gate terminal and the first gate interconnect to each other,
   wherein a resistance value of the first gate interconnect per unit length is larger than a resistance value of the second gate interconnect per unit length,
   wherein the first gate interconnect and the second gate interconnect have a configuration in which a first layer and a second layer are laminated, and wherein a width of the second layer in the first gate interconnect is smaller than a width of the second layer in the second gate interconnect.

2. The semiconductor device according to claim 1, wherein both the second layer in the first gate interconnect and the second layer in the second gate interconnect are divided into a plurality in a width direction, all widths of the second layers after division are equal to each other, and a number of the second layers in the first gate interconnect is smaller than a number of the second layers in the second gate interconnect.

3. The semiconductor device according to claim 1, further comprising an insulating interlayer which is formed over the first layer, wherein the second layer is formed on the insulating interlayer, and the second gate interconnect further includes a third layer, buried in the insulating interlayer, which connects the first layer and the second layer to each other.

4. The semiconductor device according to claim 1, further comprising a plurality of trenches, formed in the substrate, which extend in parallel to each other, wherein the gate electrodes are formed in the plurality of trenches.

* * * * *